(12) United States Patent
Li et al.

(10) Patent No.: US 11,693,046 B2
(45) Date of Patent: Jul. 4, 2023

(54) MONITORING WAVEFORMS FROM WAVEFORM GENERATOR AT DEVICE UNDER TEST

(71) Applicant: Tektronix, Inc., Beaverton, OR (US)

(72) Inventors: Yufang Li, Shanghai (CN); Sicong Zhu, Shanghai (CN); Hua Wei, Shanghai (CN); Fan Huang, Shanghai (CN); Ye Yang, Shanghai (CN)

(73) Assignee: Tektronix, Inc., Beaverton, OR (US)

( * ) Notice: Subject to any disclaimer, the term of this patent is extended or adjusted under 35 U.S.C. 154(b) by 649 days.

(21) Appl. No.: 16/148,342

(22) Filed: Oct. 1, 2018

(65) Prior Publication Data
US 2019/0033364 A1   Jan. 31, 2019

Related U.S. Application Data

(63) Continuation-in-part of application No. 15/655,859, filed on Jul. 20, 2017, now Pat. No. 10,890,604.

(51) Int. Cl.
*G01R 31/28* (2006.01)
*G01R 31/11* (2006.01)
(Continued)

(52) U.S. Cl.
CPC ..... *G01R 31/2841* (2013.01); *G01R 13/0218* (2013.01); *G01R 31/083* (2013.01);
(Continued)

(58) Field of Classification Search
None
See application file for complete search history.

(56) References Cited

U.S. PATENT DOCUMENTS 4,814,689 A * 3/1989 Obara ............ G01R 31/11
324/617
4,970,466 A * 11/1990 Bolles ............ G01R 31/11
324/533
(Continued)

FOREIGN PATENT DOCUMENTS

EP        2133710 A1 * 12/2009  ......... G01S 13/785
JP        2004140665 A  * 5/2004
WO   WO-2004074857 A1 *  9/2004 ............ G01R 31/11

OTHER PUBLICATIONS

Screen captures from YouTube video clip entitled "Measuring signal propagation delay in coaxial cables," 1 pages, uploaded on Jan. 7, 2014 by user "Arash Kamangir". Retrieved from Internet: <https://www.youtube.com/watch?v=q02NMlkmNmw>(Year: 2014).*

(Continued)

*Primary Examiner* — Lina M Cordero
(74) *Attorney, Agent, or Firm* — Miller Nash LLP; Andrew J. Harrington

(57) ABSTRACT

A test and measurement instrument including a signal generator configured to generate a waveform to be sent over a cable to a device under test (DUT) and a real-time waveform monitor (RTWM) circuit. The RTWM is configured to determine a propagation delay of the cable, capture a first waveform, including an incident waveform and a reflection waveform at a first test point between the signal generator and the DUT, capture a second waveform including at least the incident waveform at a second test point between the signal generator and the DUT, determine a reflection waveform and the incident waveform based on the first waveform and the second waveform, and determine a DUT waveform based on the incident waveform, the reflection waveform, and the propagation delay. The DUT waveform represents the waveform generated by the signal generator as received by the DUT.

19 Claims, 18 Drawing Sheets

(51) Int. Cl.
  *G01R 31/08* (2020.01)
  *G01R 13/02* (2006.01)
  *G01R 31/58* (2020.01)
  *G01R 19/25* (2006.01)

(52) U.S. Cl.
  CPC ............ *G01R 31/11* (2013.01); *G01R 31/58* (2020.01); *G01R 19/2506* (2013.01)

(56) References Cited

U.S. PATENT DOCUMENTS

| | | | | |
|---|---|---|---|---|
| 5,633,709 | A * | 5/1997 | Ohtaki | G01M 11/3145 356/73.1 |
| 5,942,902 | A * | 8/1999 | Okayasu | H03K 3/84 324/617 |
| 6,249,128 | B1 * | 6/2001 | Begg | G01R 35/005 324/601 |
| 6,853,196 | B1 * | 2/2005 | Barnum | G01R 31/11 324/532 |
| 7,005,862 | B2 * | 2/2006 | Onodera | G01R 31/11 324/646 |
| 10,473,719 | B2 * | 11/2019 | Horikami | G01R 31/31725 |
| 2006/0164066 | A1 * | 7/2006 | Shioiri | G01R 27/04 324/76.22 |
| 2007/0183459 | A1 * | 8/2007 | Eidson | G01R 19/2509 370/498 |
| 2010/0082083 | A1 * | 4/2010 | Brannan | A61B 18/1815 607/102 |
| 2010/0176789 | A1 * | 7/2010 | Zoughi | G01R 27/28 324/76.13 |
| 2016/0381123 | A1 * | 12/2016 | Kanne | H04L 67/10 709/224 |
| 2019/0302183 | A1 * | 10/2019 | Peschke | G01R 31/31712 |

OTHER PUBLICATIONS

Fluke Networks, Network Cable Propagation Delay, https://www.flukenetworks.com/knowledge-base/dtx-cableanalyzer/propagation-delay (Year: 2014).*

* cited by examiner

MONITORING WAVEFORMS FROM WAVEFORM GENERATOR AT DEVICE UNDER TEST

CROSS-REFERENCE TO RELATED APPLICATION

This application is a continuation-in-part of U.S. patent application Ser. No. 15/655,859, titled MONITORING DEVICE UNDER TEST WAVEFORM ON SIGNAL GENERATOR and filed on Jul. 20, 2017, the content of which is fully incorporated by reference herein.

TECHNICAL FIELD

This disclosure is generally directed to systems and methods related to signal generators, and, more particularly, to systems and methods for determining and displaying on a signal generator a signal received at a device under test (DUT) from the signal generator. Certain embodiments may include a method that enables arbitrary function generator (AFG) users to monitor the waveforms at the device under test (DUT) without extra instruments like an oscilloscope, instead of only seeing the ideal waveforms set on the generator.

BACKGROUND

Arbitrary Waveform and Function Generator (AFG) instruments are widely utilized for generating signals for electronic circuit design and testing. The AFG generates a signal that is received by a device under test (DUT). Typically, an AFG instrument has an output impedance of 50 Ohms over its operating frequency range. When the DUT load impedance does not match the output impedance of the AFG instrument, the signal received at the DUT is not equivalent to the user setting on the AFG instrument. In some cases, this may result in damage to the DUT, as the DUT receives a signal that is different than the signal sent by the AFG instrument.

Conventional arbitrary function generators (AFGs) are designed with a 50 Ohm internal resistor on the output path to enable the maximum output power on the load in case the load is also 50 Ohm (i.e., impedance matching, which is widely used in radio frequency (RF) systems), and also to protect the output path from a short circuit. Settings, such as amplitude or shape, on the AFG are typically based on the assumption that the output is connected to a 50 Ohm load through a 50 Ohm cable.

However, because most AFG users are not working on RF designs, the DUTs are analog or digital circuits, which are typically not 50 Ohm or even not purely resistive (i.e., unmatched impedance). In such cases, when a user connects the AFG output to the DUT through a 50 Ohm cable, it is very likely that the waveform at the DUT is different from the ideal setting on the AFG, e.g., in terms of amplitude or even shape.

If an AFG user is not aware of the difference, he or she could waste their time on a wrong test setup and incorrect results. This could lead to schedule delays or, ultimately, even faulty designs and/or products. And, even if the user is aware of the difference, he or she would need to spend time doing calculations to simulate the waveform at the DUT, or use an oscilloscope to physically test the waveform at the DUT.

Conventional systems such as those described above undesirably lead to customer pain points of waste of time, cost on extra instrument, or risk of schedule delay/faulty designs/faulty products.

Implementations in accordance with the disclosed technology address these and other deficiencies in the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
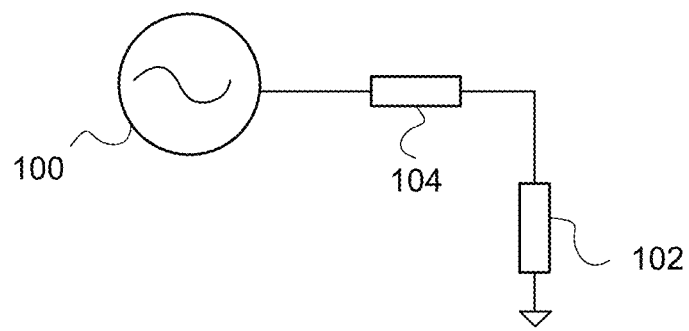
FIG. 1 is a block diagram of a signal generator connected to a device under test.

FIG. 1 is a block diagram of a signal generator 100 electrically coupled to a DUT 102. The DUT 102 has a 50 ohm impedance that matches the impedance 104 of 50 ohms of the signal generator 100. The real amplitude of a signal received at a DUT 102 is shown in equation (1):

$$\text{Real Amplitude} = \frac{DUT \text{ load}}{50 \text{ Ohm} + DUT \text{ load}} \times \text{Amplitude Setting} \times 2 \qquad (1)$$

If the impedance of the DUT 102 is not equal to 50 Ohms, then the real amplitude received at the DUT 102 is not equal to the user setting on the signal generator 100. If the DUT 102 load includes a large capacitor and inductor, the real amplitude received at the DUT 102 may be even more complex.

Figure 2:
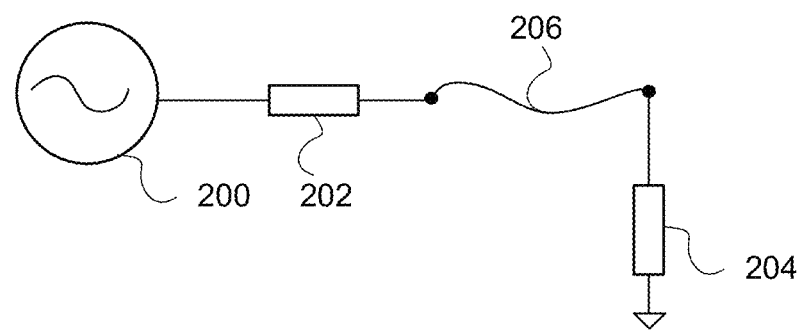
FIG. 2 is a block diagram of a signal generator connected to a device under test through a cable.

FIG. 2 illustrates an example of a system including a signal generator 200 having a 50 Ohm impedance 202 attached to a DUT 204 via a cable 206, such as a Bayonet Neill-Concelman (BNC) cable. In FIG. 2, the cable 206 causes a reflection which results in the real amplitude received at the DUT 204 being different from the user settings on the signal generator 200.

To resolve this issue, a typical user may connect an oscilloscope to the DUT 204 as well as the signal generator 200. Then, the user sees the real amplitude of the signal being received at the DUT 204, versus the signal set at the user settings. The user may then adjust the user setting on the signal generator 200 based on the waveform the user observes on the oscilloscope. However, such a solution is expensive in that it requires two pieces of equipment and a high impedance probe must be used.

Embodiments of the disclosure allow a user to determine the real amplitude of a signal being received at the DUT using only a signal generator without the need for an oscilloscope. That is, embodiments of the disclosure use a single test and measurement instrument to output a waveform and determine an actual, or real, waveform received at the DUT, and display such a waveform to a user.

Figure 3:
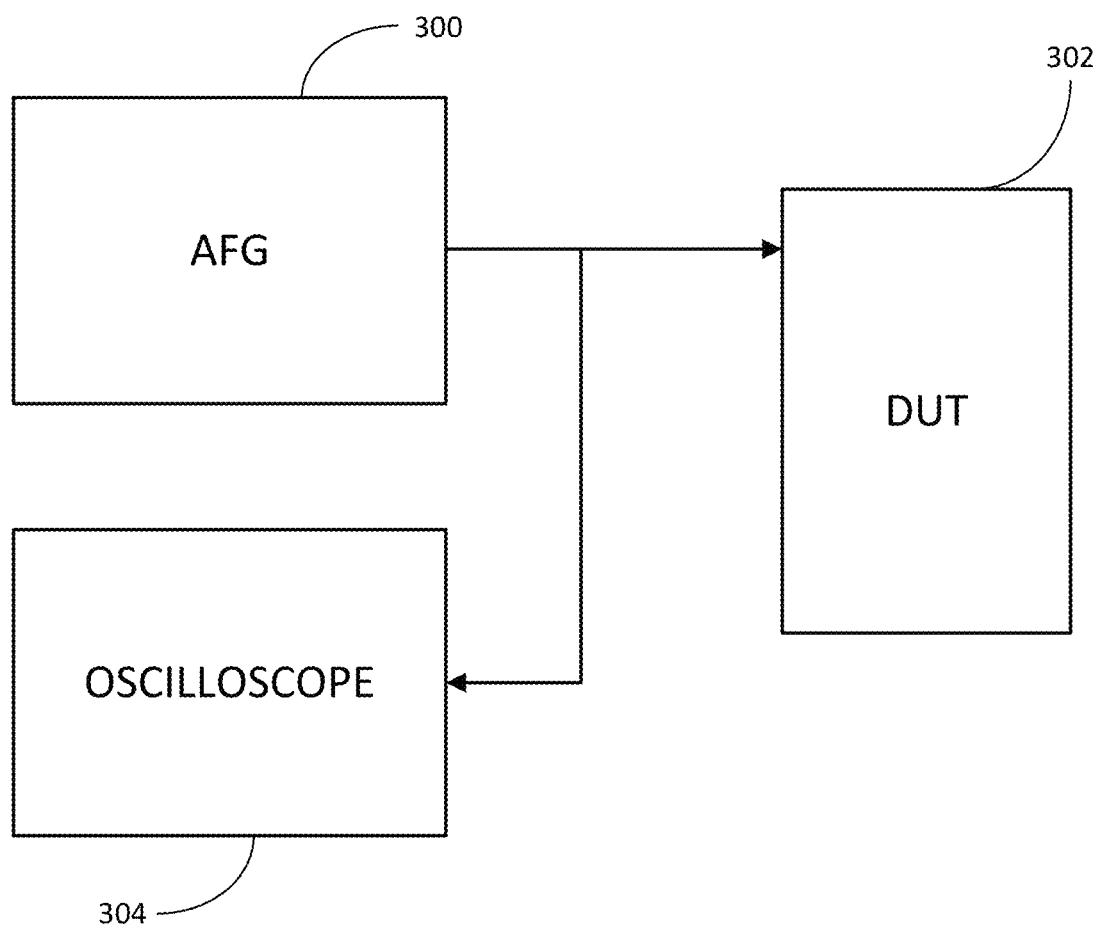
FIG. 3 illustrates an example of a system including an arbitrary/function generator (AFG).

FIG. 3 illustrates an example of a system including an arbitrary function generator (AFG) 300. In this system, an oscilloscope 304 and a DUT 302 are both connected to the AFG 300. This arrangement is disadvantageous for a number of reasons. For example, the requisite equipment is very expensive, and the oscilloscope 304 needs to be high bandwidth. Also, the need for two separate pieces of equipment (i.e., the AFG 300 and the oscilloscope 304) is inconvenient to the user. Further, the user must take care to use a high-impedance probe.

Disclosed implementations may include a test and measurement instrument having a signal generator circuit and a waveform monitor circuit for monitoring a waveform received at a device under test (DUT). The signal generator circuit may generate a waveform based on an input from a user, while the waveform monitor circuit may send captured signals to a processor to determine a waveform received at the DUT. The waveform monitor may capture a signal at a first test point and a second test point, via a switch in some implementations, and the processor may receive the captured signals and, using linear equations, determine both an incident waveform and a reflected waveform from the DUT.

Such implementations may advantageously allow a user to determine the real amplitude of a signal being received at the DUT using only a signal generator without the need for an oscilloscope. That is, embodiments of the disclosure use a single test and measurement instrument to output a waveform and determine an actual, or real, waveform received at the DUT, and display such a waveform to a user.

Figure 4:
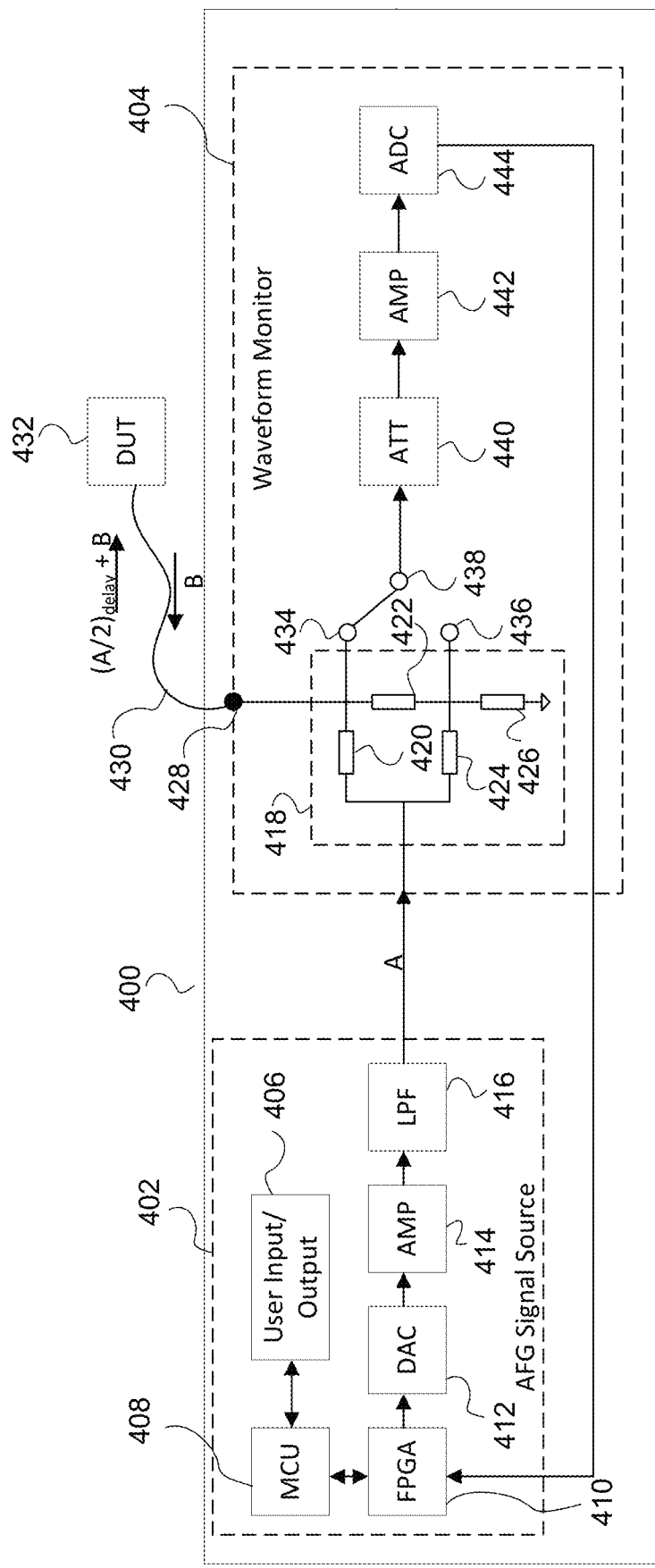
FIG. 4 is a block diagram of an exemplary test and measurement instrument according to some embodiments of the disclosure.

FIG. 4 illustrates a test and measurement system 400 according to embodiments of the disclosure. The test and measurement instrument 400 may be an arbitrary function generator or signal generator. The test and measurement instrument 400 includes an arbitrary function generation (AFG) signal source 402 portion and a waveform monitor 404 portion. Although the AFG signal source 402 and the waveform monitor 404 are depicted as separate, as would be understood by one having ordinary skill in the art, the components of the devices may be intermingled in one or more circuit boards and not actual separate devices.

The AFG signal source 402 includes a user input/output 406, such as a display screen with a dialog box. The AFG signal source 402 may also include a processor, such as a microcontroller unit 408 that communicates with the user input/output 406 as well as a field programmable gate array (FPGA) 410. In some embodiments, only a microcontroller unit (MCU) 408 or a FPGA 410 may be used, rather than a combination of both. In other embodiments, the processor may be implemented via one or more circuits, such as noise filters, interpolators, conversion circuits, etc., a digital signal processor (DSP), a general purpose processor, MCU 408, FPGA 410, and/or combinations thereof. Further, MCU 408 and/or the FPGA 410 may be located outside the AFG signal source 402 and may be located in the waveform monitor 404 or elsewhere within the test and measurement system 400.

Initially, a user inputs into the input/output 406 parameters of a desired signal to be generated. The MCU 408 processes this information and sends instructions to the FPGA 410. The FPGA 410 outputs a signal based on the user input and the instructions from the MCU 408. The signal from the FPGA 410 is converted to an analog signal through a digital-to-analog converter (DAC) 412. The converted signal passes through an amplifier 414 and a low pass filter 416 and is output as signal A to the waveform monitor 404. Other circuit variations may be used, as well, to output the generated signal A to the waveform monitor, as would be understood by one skilled in the art.

A directional coupler 418 of the waveform monitor 404 receives signal A and splits the signal into a first signal and a second signal. The first signal and the second signal both include the incident waveform which is theoretically half of signal A. However, as understood by one of ordinary skill in the art, various interferences and resistances within the test and measurement system may cause the first and second signal to not be exactly half of signal A. The directional coupler 418 includes four resistors 420-426 for splitting signal A into the first and second signals. In some embodiments, each resistor may be 50 Ohms.

The directional coupler 418 outputs the first signal from an output 428 to a BNC cable 430 connected to a DUT 432. A reflected waveform B from the DUT 432 travels back toward the output 428 through the cable 430. The reflected waveform B affects the first signal, such that the signal received at the device under test is determined by the following equation (2):

$$DUT \text{ waveform} = \left(\frac{A}{2}\right)_{delay} + B \qquad (2)$$

The delay is the delay from the signal traveling through the BNC cable 430. This delay may be stored in a memory of the test and measurement instrument 400 or the delay may be entered in the test and measurement system via the user input/output 406. For example, the test and measurement system may display a dialog box requesting the BNC cable 430 delay amount. A user may then enter this delay. The user may determine the delay of the BNC cable 430 by using an oscilloscope to measure the delay of the cable. In some embodiments, the test and measurement instrument 400 may automatically determine the delay of the BNC cable 430.

The waveform monitor circuit 404 includes two test points 434 and 436 to allow the processor to determine the DUT waveform. That is, using linear equations, the waveform monitor circuit 404 calculates the incident waveform which should be approximately half of signal A and the reflected waveform B. A switch 438 selects between the two test points 434 and 436. First test point 434 includes a first signal which is the incident waveform plus the reflected waveform B. Second test point 436 includes a second signal which is the incident waveform plus half the reflected waveform B. When either the first test point 434 or the second test point 436 is selected by switch 438, the signal at the selected test point is processed through an attenuator 440, an amplifier 442, and is converted to a digital signal via an analog-to-digital converter (ADC) 444. The digital signal is then sent to the FPGA 410 to be processed by the FPGA 410 and the MCU 408 to determine the DUT waveform. The signal may be saved in a memory (not shown) prior to being processed.

The method for determining the DUT waveform is based on high speed signal reflection. A DUT load reflection coefficient $\Gamma_L$ is shown by equation (3):

$$\Gamma_L = \frac{Z_L - Z_c}{Z_L + Z_c} \quad (3)$$

$Z_L$ is the impedance of the DUT load and $Z_C$ is the BNC cable impedance of typically 50 Ohms.

The signal source side reflection coefficient $\Gamma_S$ is shown by equation (4):

$$\Gamma_S = \frac{Z_S - Z_c}{Z_S + Z_c} \quad (4)$$

$Z_S$ is the impedance of the AFG signal source 402 which is typically 50 Ohms. Since the AFG signal source 402 and the BNC cable have the same impedance, the signal source side reflection coefficient $\Gamma_S$ is 0 and there is not an AFG signal source 402 reflection.

The DUT waveform is determined by equation (5):

$$DUT\ \text{waveform} = V_{incident} + V_{incident} * \Gamma_L = \frac{A}{2} + \frac{A}{2} * \Gamma_L = \left(\frac{A}{2}\right)_{delay} + B \quad (5)$$

For an arbitrary waveform, $$\frac{A}{2} * \Gamma_L$$

is difficult to calculate by a processor, so the above method is best suited for a time domain analog waveform, using ADC 444 to convert the waveform, as discussed above.

The directional coupler 418 works as a balance bridge and splits the incident waveform and the reflected waveform. If a DUT impedance is equal to 50 Ohms, then there is no reflected signal B. If the DUT impedance is not equal to 50 Ohms, then the test and measurement instrument 400 is able to determine the DUT waveform based on measuring the values at the first test point 434 and the second test point 436.

Figure 5:
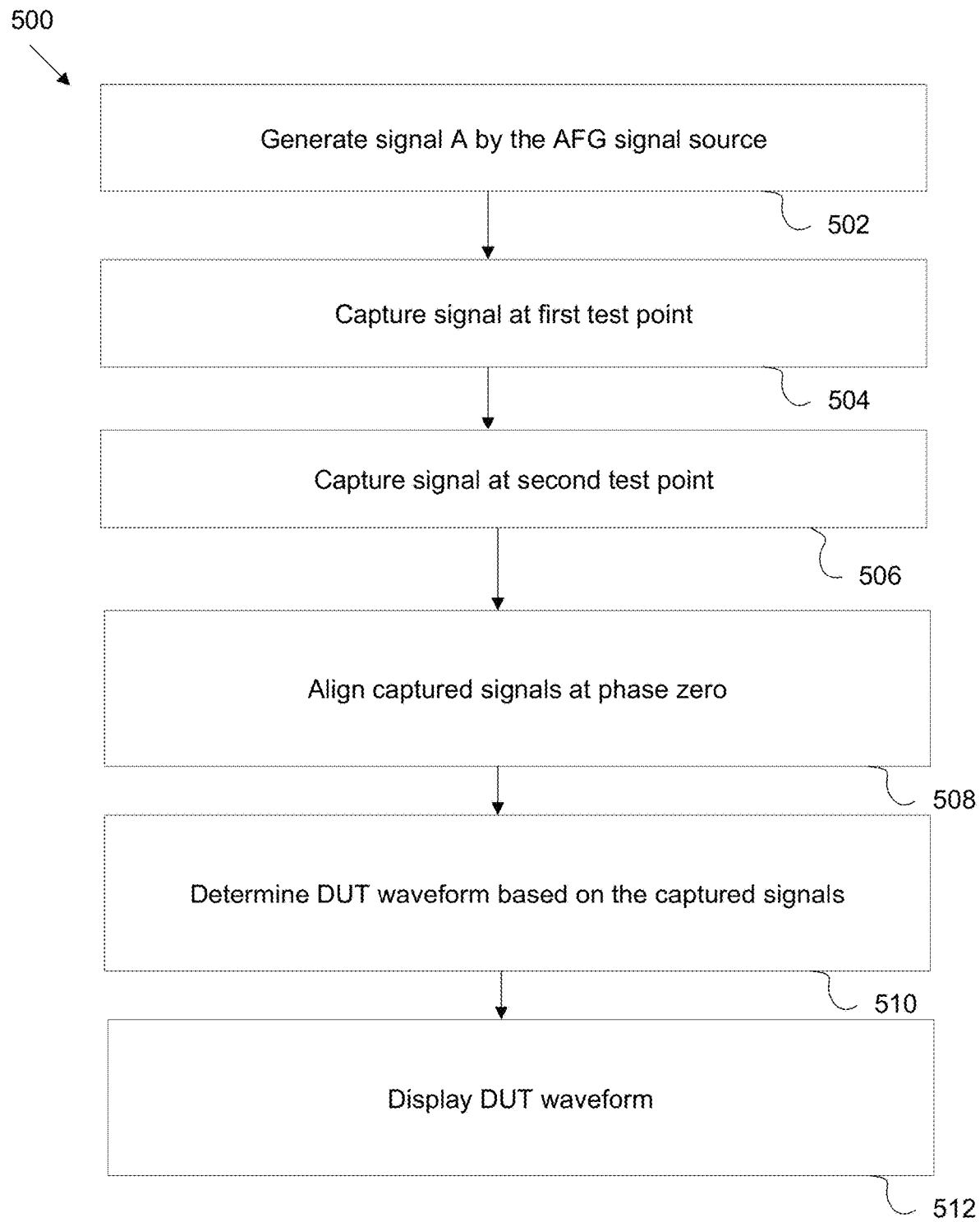
FIG. 5 is a flow chart of an example method to determine a DUT waveform using the test and measurement instrument of FIG. 3.

FIG. 5 illustrates a method 500 for determining the incident waveform received by the DUT 432, using the MCU 408 and FPGA 410.

Initially, a signal A is generated 502 by the AFG signal source 402 based on a user input. The switch 438 is set to capture 504 the signal at the first test point 434. Then, the switch 438 is set to capture 506 the signal at the second test point 436. The switch 438 may capture the signal second at the second test point 436 prior to capturing the first signal at the first test point 434. Both captured signals are converted to digital signals and sent to the FPGA 410, which time-aligns 508 both the signals to the AFG direct digital synthesizer (DDS) at phase zero. The FPGA sends the signals from both test points 434 and 436 to the MCU 408 to determine 510 the waveform at the DUT 432. Using the linear equations, the MCU 408 calculates the incident waveform and the reflected waveform.

Using the calculated incident waveform (A/2) and reflected waveform (B), the waveform present at the DUT 432 can be calculated using equation (2) above.

Once the DUT waveform is calculated, the DUT waveform is displayed 512 on the user input/output 406 so a user may make adjustments at the user input/output to receive the signal desired at the DUT 432.

Figure 6:
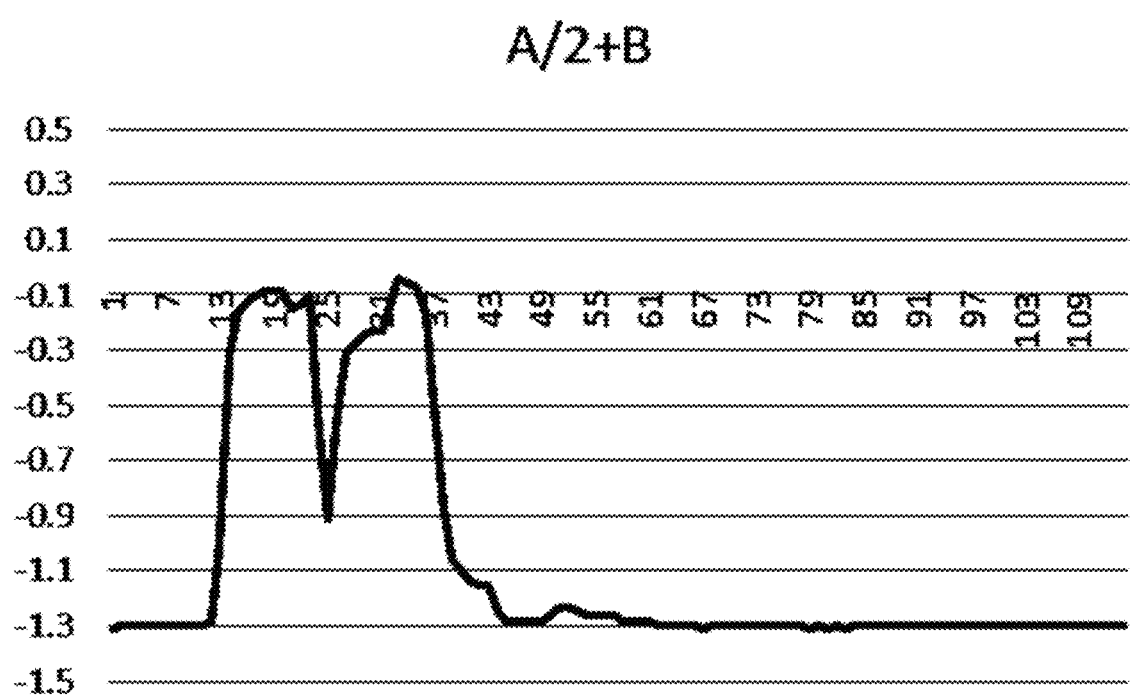
FIG. 6 is an example of a captured waveform at a first test point.
Figure 7:
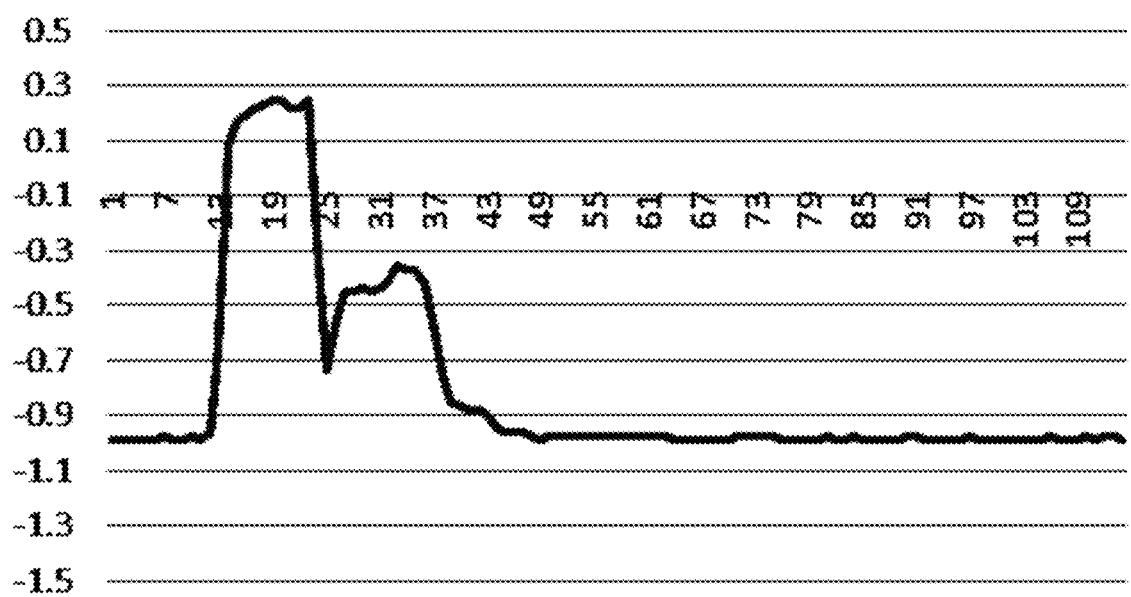
FIG. 7 is an example of a captured waveform at a second test point.
Figure 8:
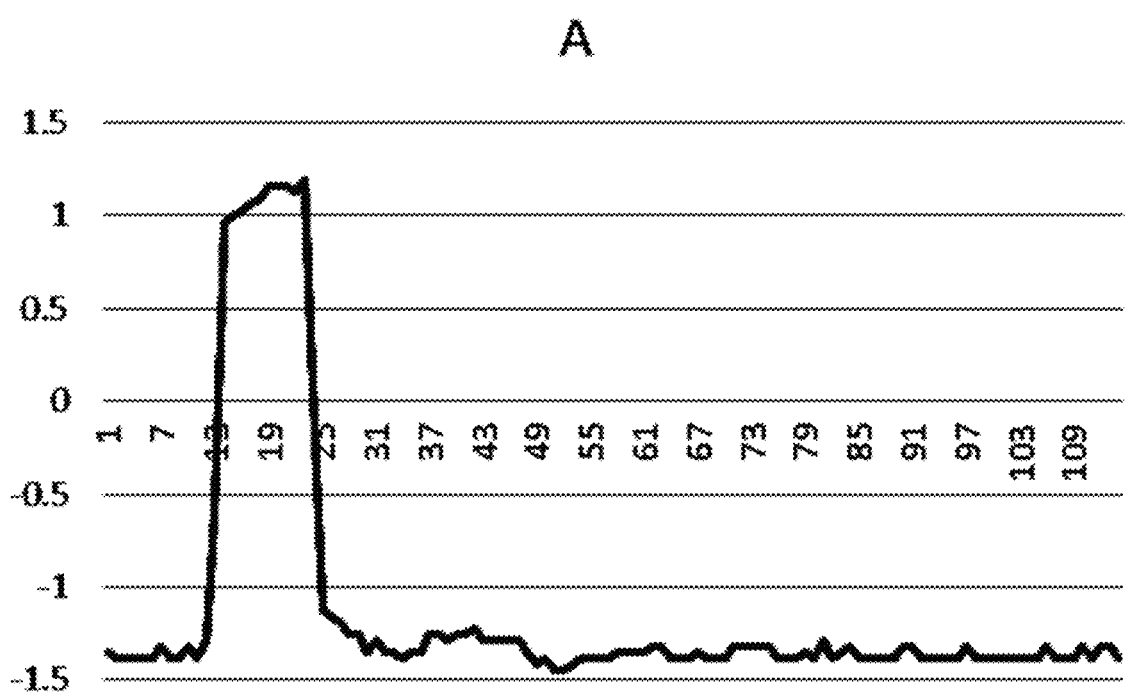
FIG. 8 is an example of a determined waveform A based on the waveforms of FIGS. 6 and 7.
Figure 9:
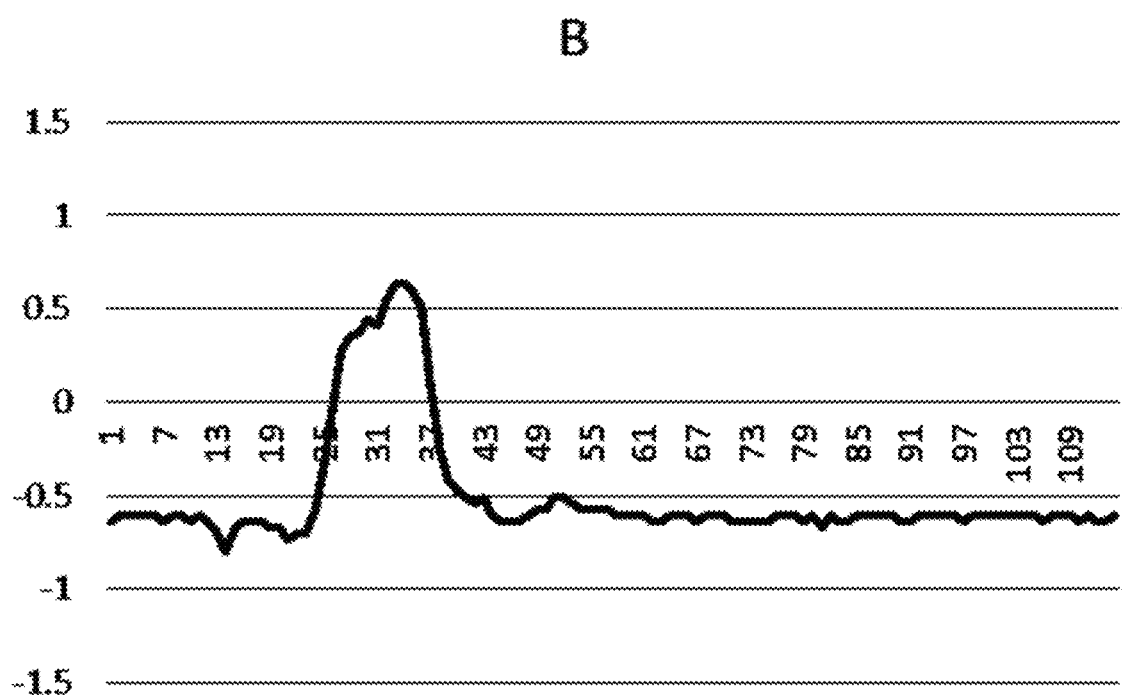
FIG. 9 is an example of a determined waveform B based on the waveforms of FIGS. 6 and 7.
Figure 10:
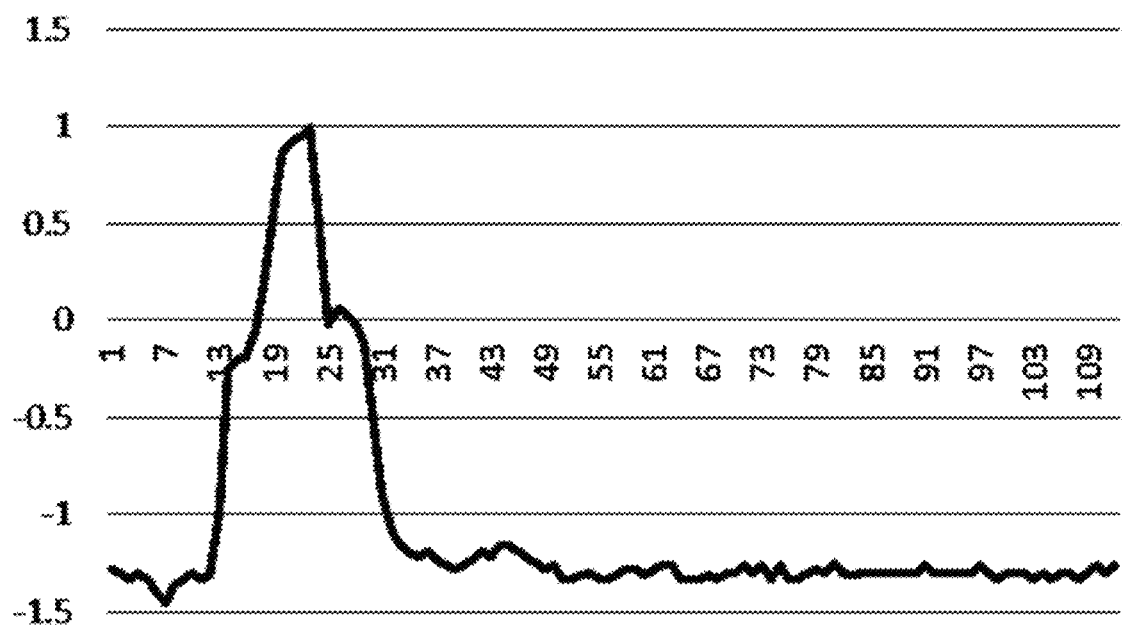
FIG. 10 is an example of a determined DUT waveform based on the waveforms of FIGS. 8 and 9.

FIGS. 6-10 illustrate example captured waveforms and the determined waveforms from the captured waveforms. In the plots of FIGS. 6-10, the vertical axis represents the amplitude of the captured waveform, typically in units of Volts, and the horizontal axis represents the sample point number of the captured waveform, which is equivalent to units of time when the sample rate of the waveform monitor 404, i.e. of the ADC 444, is known. FIG. 6 illustrates a captured waveform at the first test point 434, consisting of signals A/2+B. FIG. 7 illustrates a captured waveform at the second test point 436, consisting of signals A/2+B/2. Based on these captured waveforms, the MCU 408 determines both incident waveform A, as shown in FIG. 8 and reflected waveform B, as shown in FIG. 9. Using these determined waveforms, the MCU 408 is able to determine the DUT waveform, as shown in FIG. 10. This waveform may then be displayed on the user input/output 406 so that a user can see the actual waveform received at the DUT 432. Depending on the waveform the user wants to use to test the DUT 432, the user is able to easily make adjustments to the input so that the desired waveform is received at the DUT.

In some embodiments, the FPGA 410 may control equivalent sampling and capture signals at test points 434 and 436 a variety of times. The FPGA 410 then sends the captured signals after the equivalent sampling has finished.

Figure 11:
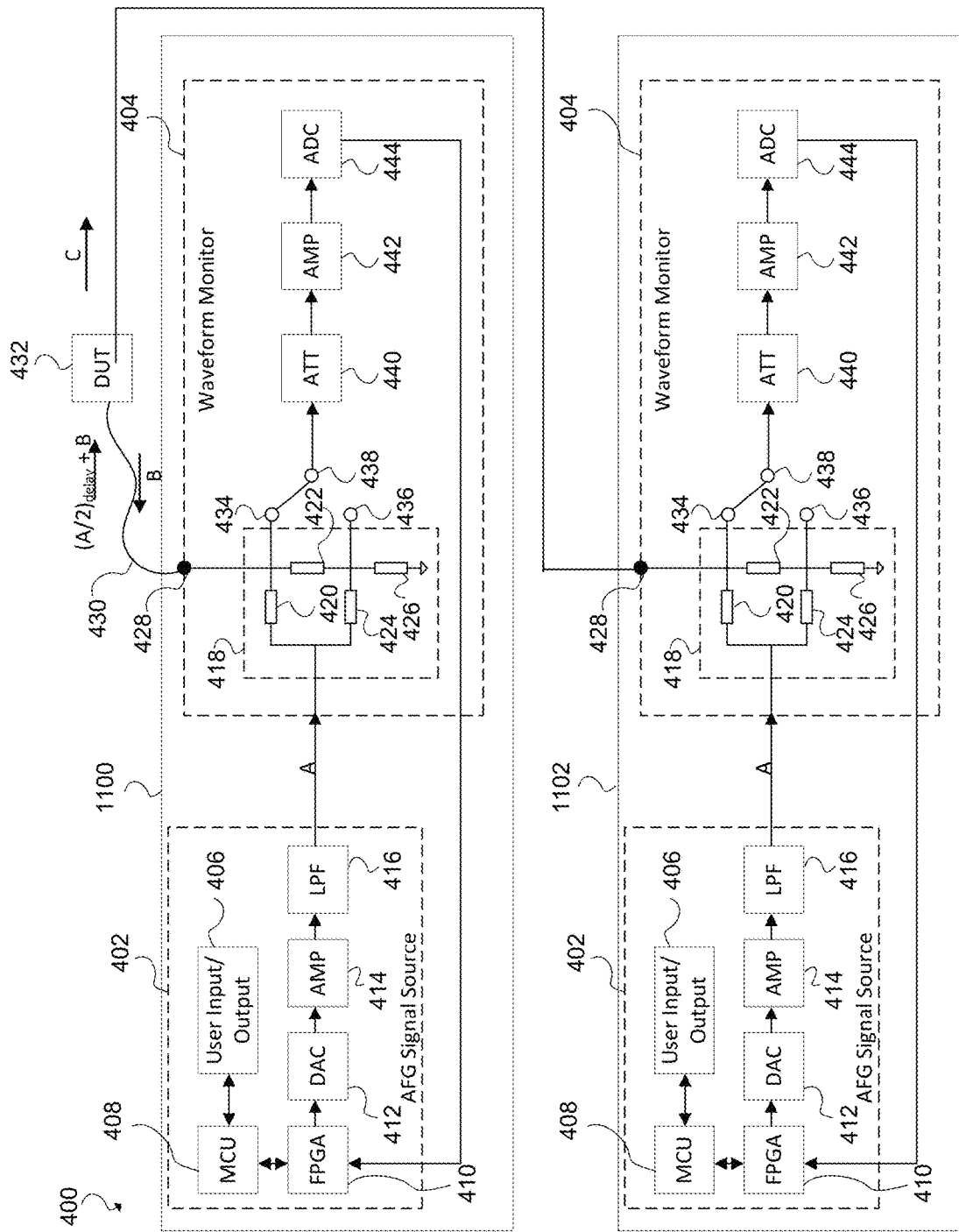
FIG. 11 is a block diagram of an exemplary test and measurement instrument according to other embodiments of the disclosure.

Still yet, in other embodiments, the instrument discussed above may be used to test a frequency response line during filter or amplifier design, as shown in FIG. 11. The test and measurement device 400 may include multiple channels 1100 and 1102 within the test and measure device, each channel including the AFG signal source 402 and the waveform monitor 404 discussed in detail above. Accordingly, similar features in each channel 1100 and 1102 are identified with the same reference number. Although two channels are depicted in FIG. 11, more than two channels may be included within the test and measurement device 400. Further, some channels may include features and components different from the channels 1100 and 1102.

To test a frequency response of DUT 432, the test and measurement instrument 400 may generate a sweep sine wave to a DUT load on a first channel 1100. In this configuration, the switch 434 of channel 1100 is set to test point 434. A waveform monitor circuit 404 of a second channel 1102 connects to the DUT 432 through the BNC output 428 of the second channel 1102. The output from the DUT is a waveform C.

The switch 438 of channel 1102 is set to test point 434 and does not generate any signal from the AFG signal source 402. In the scenario, channel 1100 acts as a normal AFG and generates a sweep sine wave, and channel 1102 receives the DUT 432 response signal C as an oscilloscope and the test point 434 of channel 1102 is the signal of DUT response C. Channel 1102 sends the DUT response signal C to FPGA 410 of channel 1102 and then to MCU 408 of channel 1102 so that the DUT frequency response can be acquired.

Certain embodiments may include incorporating a low-cost circuit into an arbitrary function generator (AFG) and integrating algorithms running on the field-programmable gate array (FPGA) and central processing unit (CPU) inside the AFG. Such embodiments advantageously enable AFG users to monitor the waveform at the DUT in real time without the need of an oscilloscope. Whenever a user changes settings on the AFG, he or she is able to see the impact on the waveform at the DUT immediately, e.g., regardless of the DUT impedance. These embodiments help AFG users to save time and cost on simulating and/or measuring the waveforms, and also may significantly reduce the risk of schedule delays and faulty designs and/or products.

In these embodiments, the cable impedance (Zc) generally matches the AFG output impedance (Zs), e.g., so that there is no second reflection at the AFG output end. Insertion loss of the cable can be ignored within the AFG output. FIGS. 12-20 are generally directed to alternative implementations of the waveform monitor 404, discussed above.

Implementations for obtaining the incident and reflection waveforms may include capturing the waveform at the output of the AFG and splitting it into incident and reflection waveforms. One example of doing such is described above with respect to FIGS. 4-11. In particular, the waveform monitor 404 may include the directional coupler 418, described above.

Figure 12:
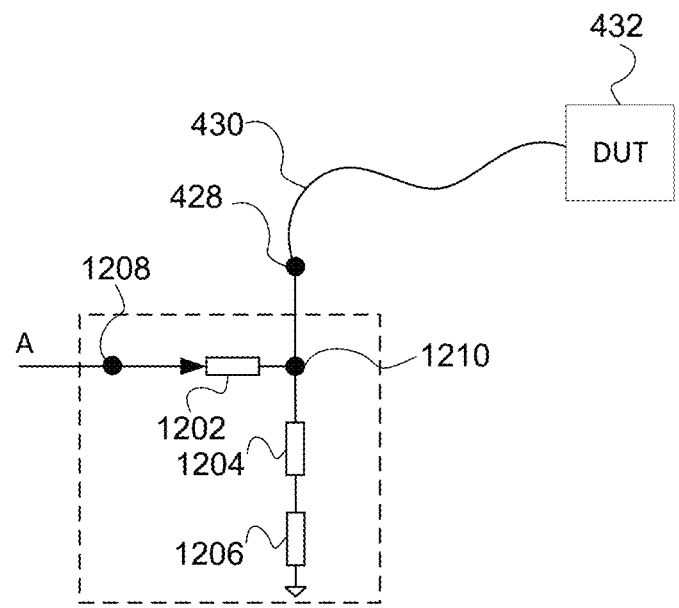
FIG. 12 is an example block diagram of a detection circuit according to some embodiments of the disclosure.

As an alternative to the directional coupler 418 in FIG. 4, the waveform monitor 404 may include a detecting circuit as illustrated in FIG. 12. For ease of discussion and illustration, only the detecting circuit, output 428, BNC cable 430, and DUT 432 are shown in FIG. 12. However, as understood by one skilled in the art, the detecting circuit may replace the directional coupler 418 in the waveform monitor 404, in this embodiment. The detecting circuit may include resistors 1202, 1204, and 1206. The testing point 1208 may be connected to the switch 434 in the waveform monitor 404 to determine the signal at testing point 1208 and the testing point 1210 may be connected to the switch 436 in the waveform monitor 404 to determine the signal at testing point 1210.

As an example, the resistor 1202 may be a 5 Ohm resistor, resistor 1204 may be a 50 Ohm resistor and resistor 1206 may be a 500 Ohm resistor. In this case, the captured waveform at testing point 1208 is consisting of signals A+10B/11. The captured waveform at testing point 1210 consists of signals 55A/61+B. These signals can then be used to determine signals A and B, which can be used to calculate the DUT waveform, using the following equation:

$$DUT \text{ waveform} = \left(\frac{55A}{61}\right)(t) + B_{(-t)} \quad (6)$$

Changing the resistance of any of the resistors 1202, 1204, or 1206 will change equation (6) accordingly, as would be understood by one skilled in the art.

Figure 13:
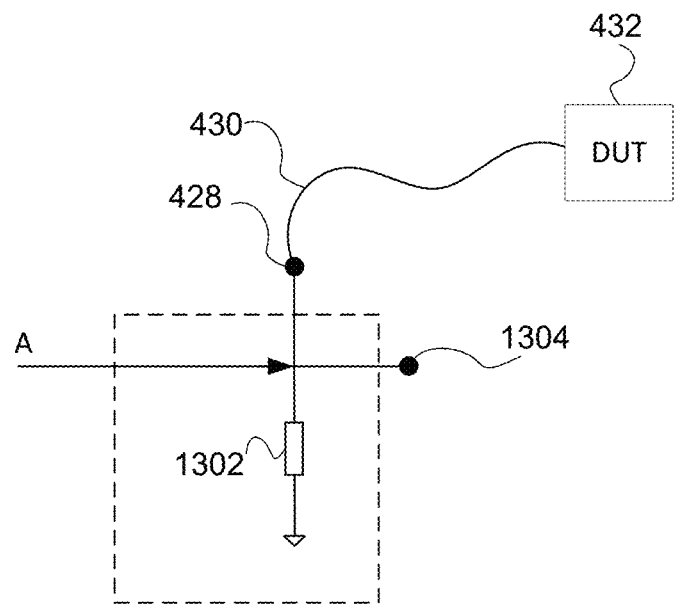
FIG. 13 is an example block diagram of another detection circuit according to some embodiments of the disclosure.

Another alternative to the directional coupler 418 is illustrated in FIG. 13. Similar to FIG. 12, for ease of discussion and illustration, only the detecting circuit, output 428, BNC cable 430, and DUT 432 are shown in FIG. 13. However, as understood by one skilled in the art, the detecting circuit may replace the directional coupler 418 in the waveform monitor 404, in this embodiment.

Detecting circuit may include a resistor 1302. Testing point 1304 may be connected to switch 436 in the waveform monitor 404 to determine the signal at testing point 1304 and the output 428 may be connected to switch 434 in the waveform monitor 404 to determine the signal at the output 428.

As an example, the resistor 1302 may be a 50 Ohm resistor. In such an example, the captured waveform at testing point 1304 consists of just signal the incident waveform A. The output 428 consists of signs A+B. Using these waveforms at testing point 1304 and output 428, the DUT waveform can be calculated as:

$$DUT \text{ waveform} = A_{(t)} + B_{(-t)} \quad (7)$$

The notation "(t)" in equation (7) indicates the signal delayed by a time t, the propagation delay of the cable 430. Changing the resistance of resistor 1304 will change equation (7) accordingly, as would be understood by one skilled in the art.

Figure 14:
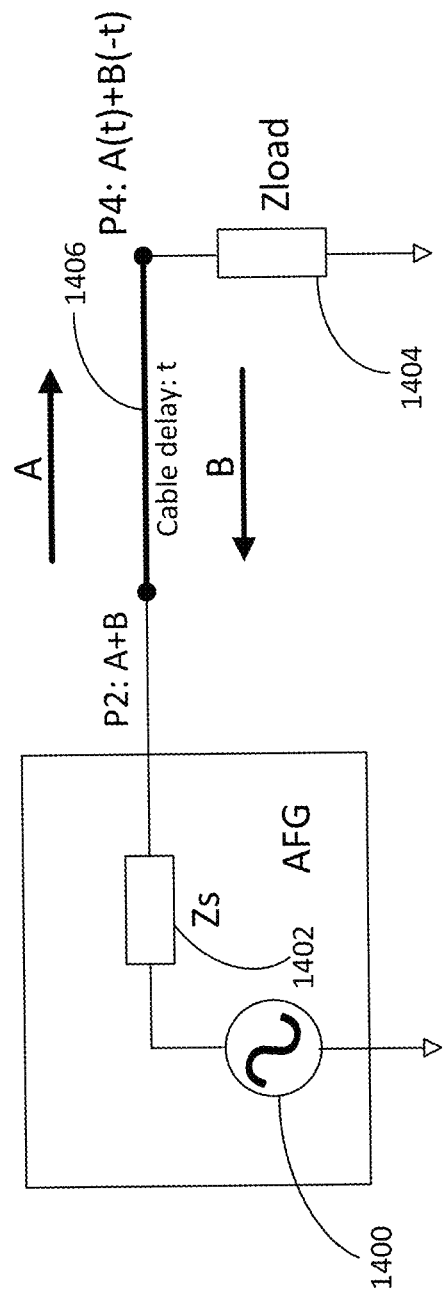
FIG. 14 illustrates an example of a real-time waveform monitor (RTWM) system in accordance with implementations of the disclosed technology.

FIG. 14 illustrates an example of a real-time waveform monitor (RTWM) system in accordance with implementations of the disclosed technology. In FIG. 14, the detecting circuit is illustrated. The RTWM system includes an AFG having a signal generator 1400 and an impedance Zs 1402, a DUT 1404 having an impedance Zload, and a cable 1406. In the example, when the output is turned on, the AFG may start to send waveforms (A) (e.g., incident waveforms) to the DUT 1404. If the impedance of the DUT 1404 (i.e., Zload) doesn't match the impedance 1402 of the AFG (i.e., Zs), there will be reflections (B) that bounce back from the DUT 1404, e.g., according to the theory of transmission line.

At a first test point (P2) located at the output of the AFG, the composition (A+B) of the incident and reflection waveforms (e.g., with 2x of the propagation delay t on the cable 1406) may be captured. If the captured waveforms (A+B) can be split into separate waveforms A and B, the waveform at a second test point (P4) at the DUT can be deduced to be A(t)+B(−t). Embodiments generally include obtaining the propagation delay (t), capturing the waveform at the first test point (P2), and splitting the waveform into A and B.

Implementing the disclosed RTWM at the AFG may include identifying the propagation delay on the cable 1406, capturing the waveform at the output (P2) of the AFG and splitting it into incident and reflection waveforms, synthesizing the waveform at the DUT 1404 with the incident and reflection waveforms and the propagation delay on the cable 406, and visually presenting the waveform at the DUT 1404.

Implementations for obtaining the cable's 1406 propagation delay may include any of the following: 1) obtaining it directly from the datasheet of the cable 1406, if provided by the vendor (e.g., it can be typed into a dialog box on the AFG user interface (UI)); 2) measuring it with additional equipment, such as an oscilloscope or TDR; or 3) using an AFG cable measurement function to obtain the cable's electrical length, e.g., using a single step.

Once the incident and reflection waveforms and cable propagation delay are all identified, the waveform at the DUT 1404 can be determined, e.g., A(t)+B(−t). This step can be done with the digitized samples in the digital domain within a logic circuit or a microprocessor, or it can be done with delay circuits in analog domain, for example. Once the waveform has been determined, it can be visually presented at the DUT 404 to a user. Alternatively or in addition thereto, the waveform may be stored, e.g., in memory for further processing.

In the example, the cable propagation delay may be identified. Before the generator's output is connected to a DUT, e.g., through a 50 Ohm BNC to BNC cable, it may be looped back to trigger input first. The generator may then generate a pulse and wait until the pulse reaches the trigger input port and get the generator triggered. By measuring the time in between, the cable propagation delay can be measured.

Figure 15:
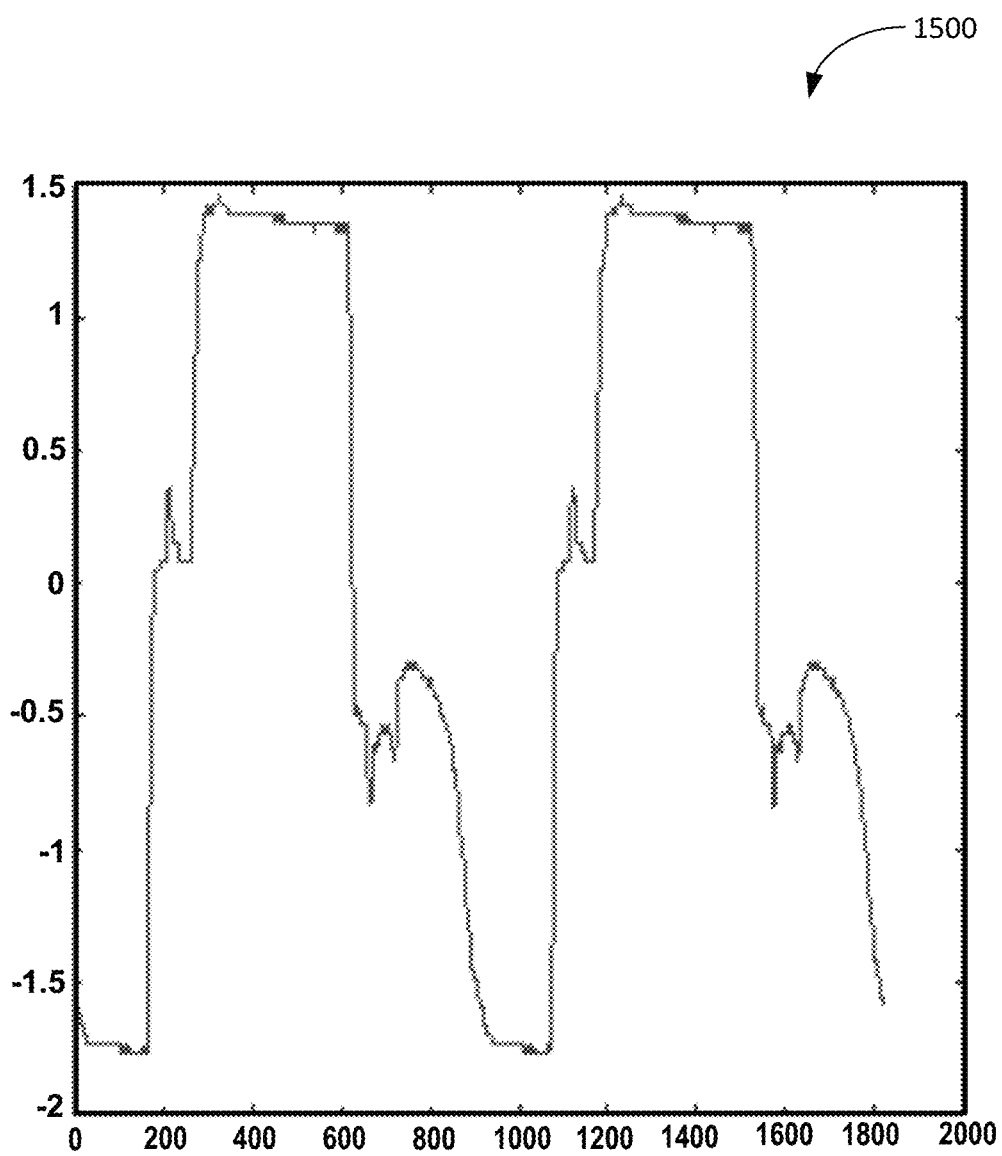
FIG. 15 illustrates an example of a combination waveform captured at a first test point.
Figure 16:
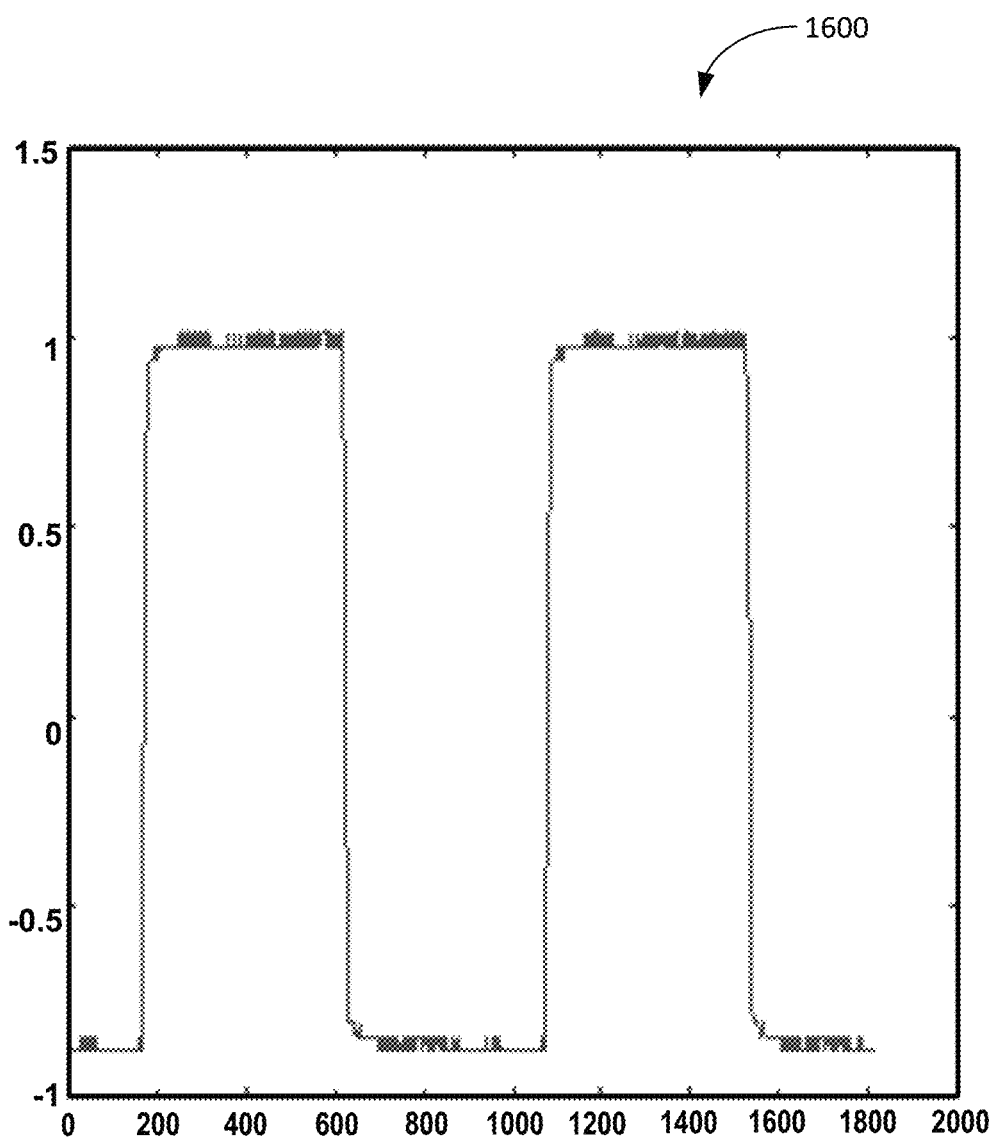
FIG. 16 illustrates an example of an incident waveform captured at a second test point.
Figure 17:
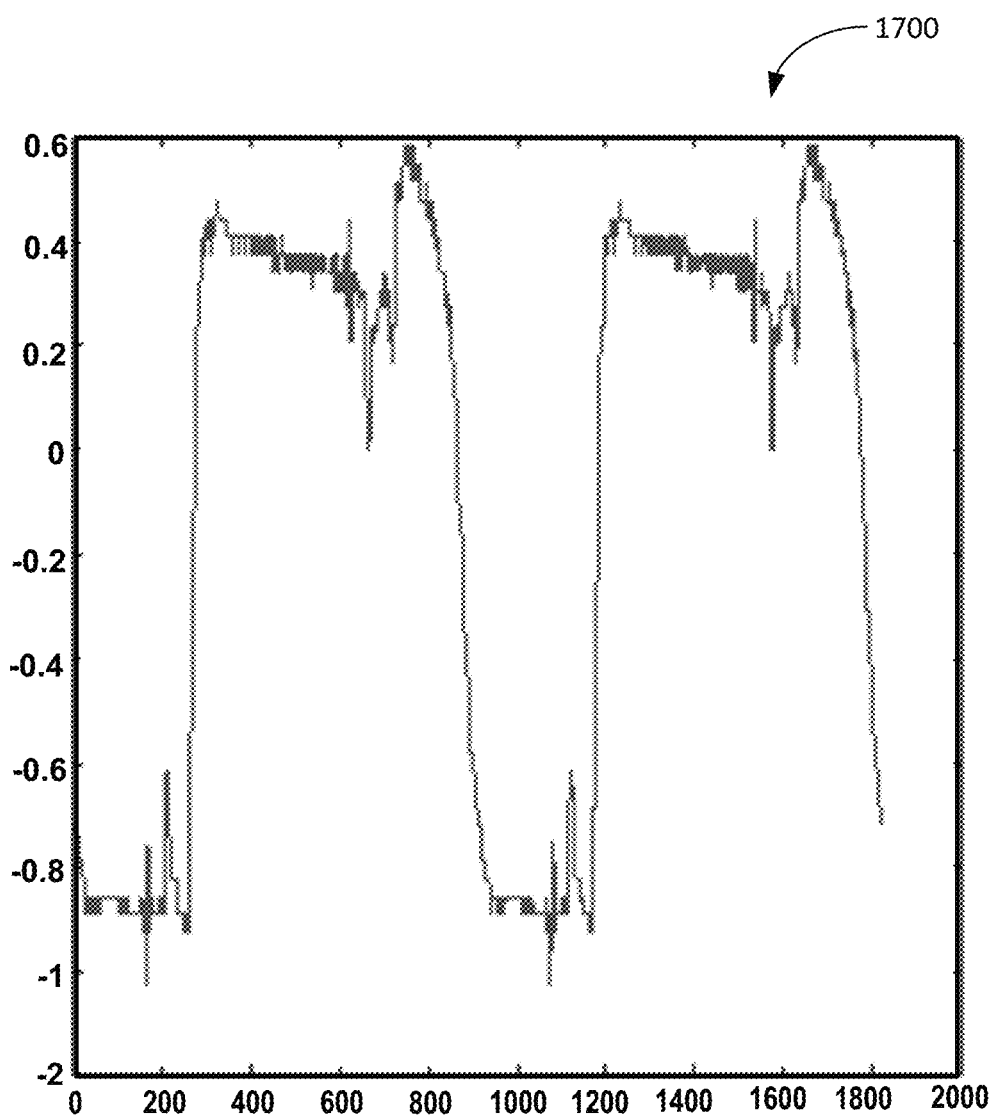
FIG. 17 illustrates an example of a reflection waveform that is determined based on the combination waveform illustrated by FIG. 15 and the incident waveform illustrated by FIG. 16.

To obtain incident and reflection waveforms, an RTWM detecting circuit, such as the RTWM detecting circuit 1400, may be used, e.g., with formula A(t)+B(−t). The testing point 1404 waveform 1500 (e.g., the combination waveform representing the incident and reflection waveforms (A+B)) may be captured, as illustrated by FIG. 15. The output 428 waveform 1600 (e.g., the incident waveform (A)) may be captured as illustrated by FIG. 16. The reflection waveform 1700 (e.g., waveform (B)) may be calculated using a binary linear equation, e.g., by an MCU, as illustrated by FIG. 17. This can be done by using the calculation (A+B)−A, for example.

Figure 18:
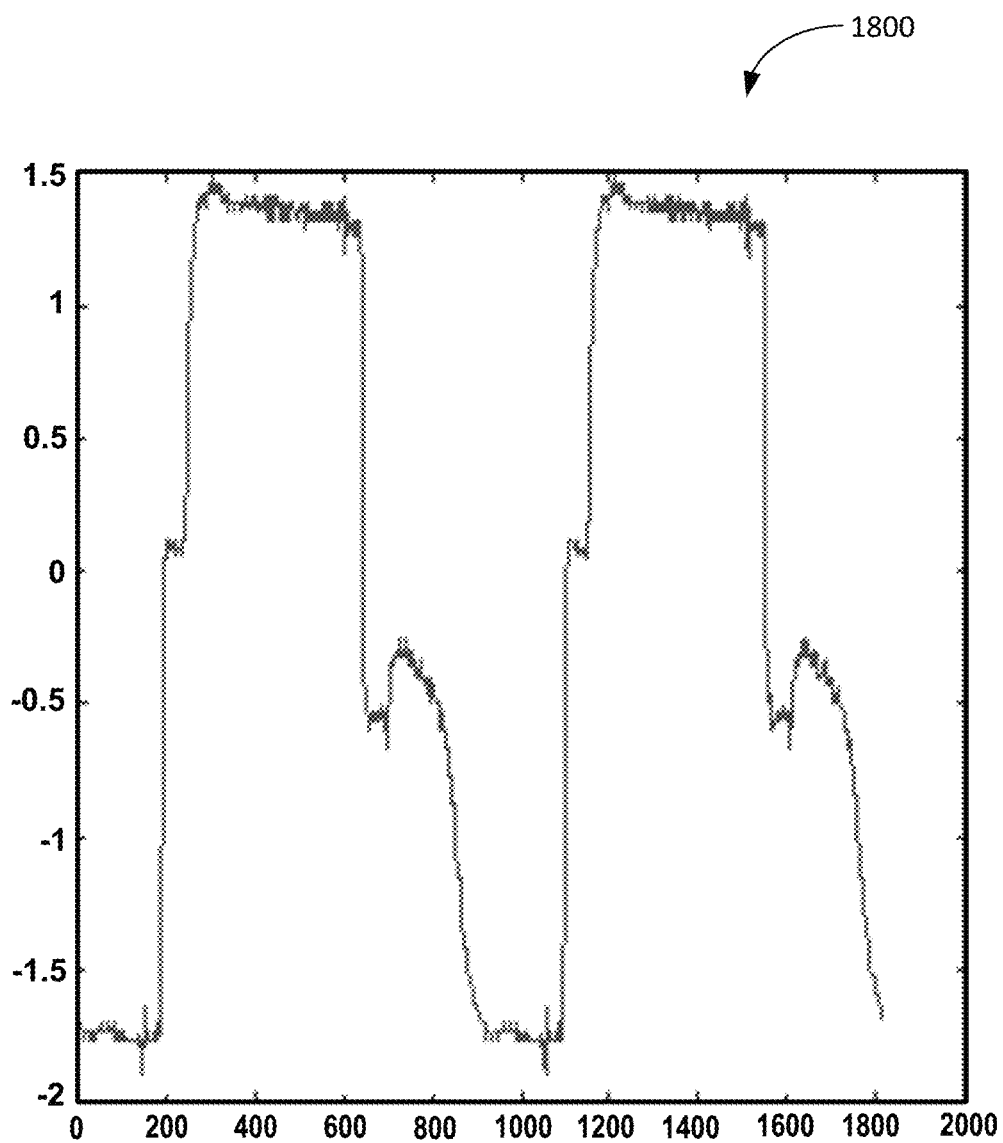
FIG. 18 illustrates an example of a recovered DUT waveform.
Figure 19:
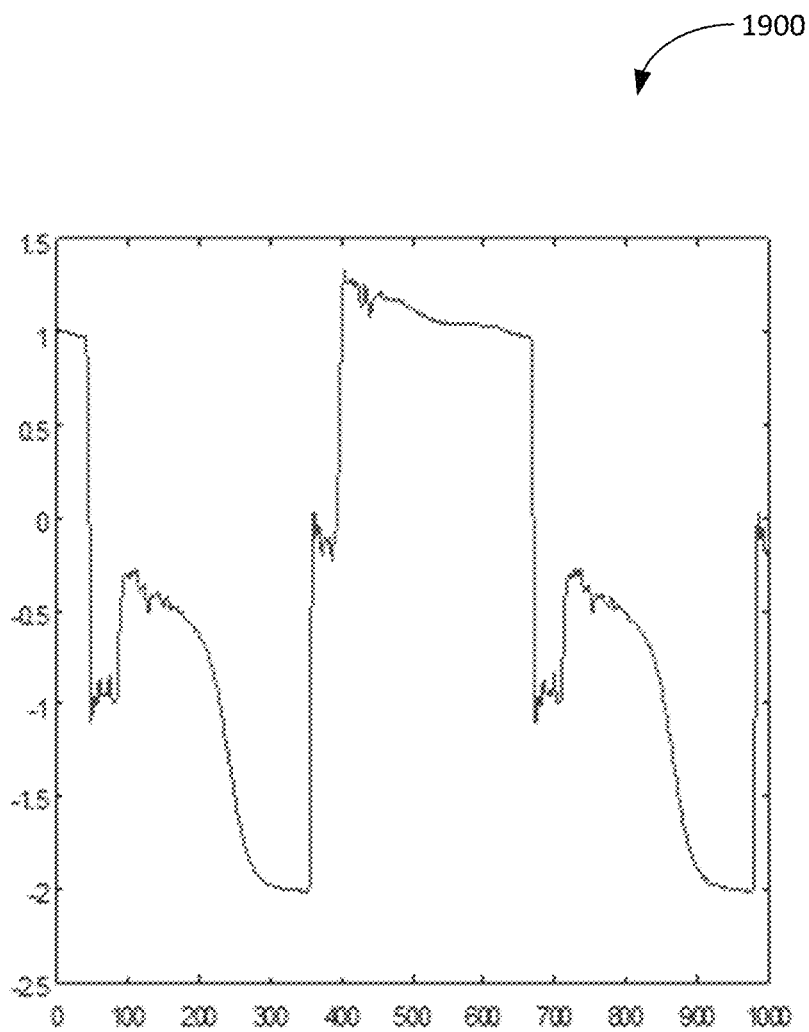
FIG. 19 illustrates an example of a DUT waveform on an oscilloscope.

The waveform at the DUT 432 can then be synthesized, e.g., with the incident and reflection waveforms and the propagation delay on cable. The DUT 432 waveform 1800 may be calculated using A(t)+B(−t), e.g., by the MCU, as illustrated by FIG. 18. Samples of waveform A may be shifted by 2x cable delay and added to B, as the time delay between A(t) and B(−t) is fixed at 2t. The calculated DUT 432 waveform 1800 may be verified by an oscilloscope, as illustrated by FIG. 9. The final composite waveform 1900 may be displayed at the test and measurement instrument 400, e.g., to help a customer understand the real input waveform at the DUT 432.

Figure 20:
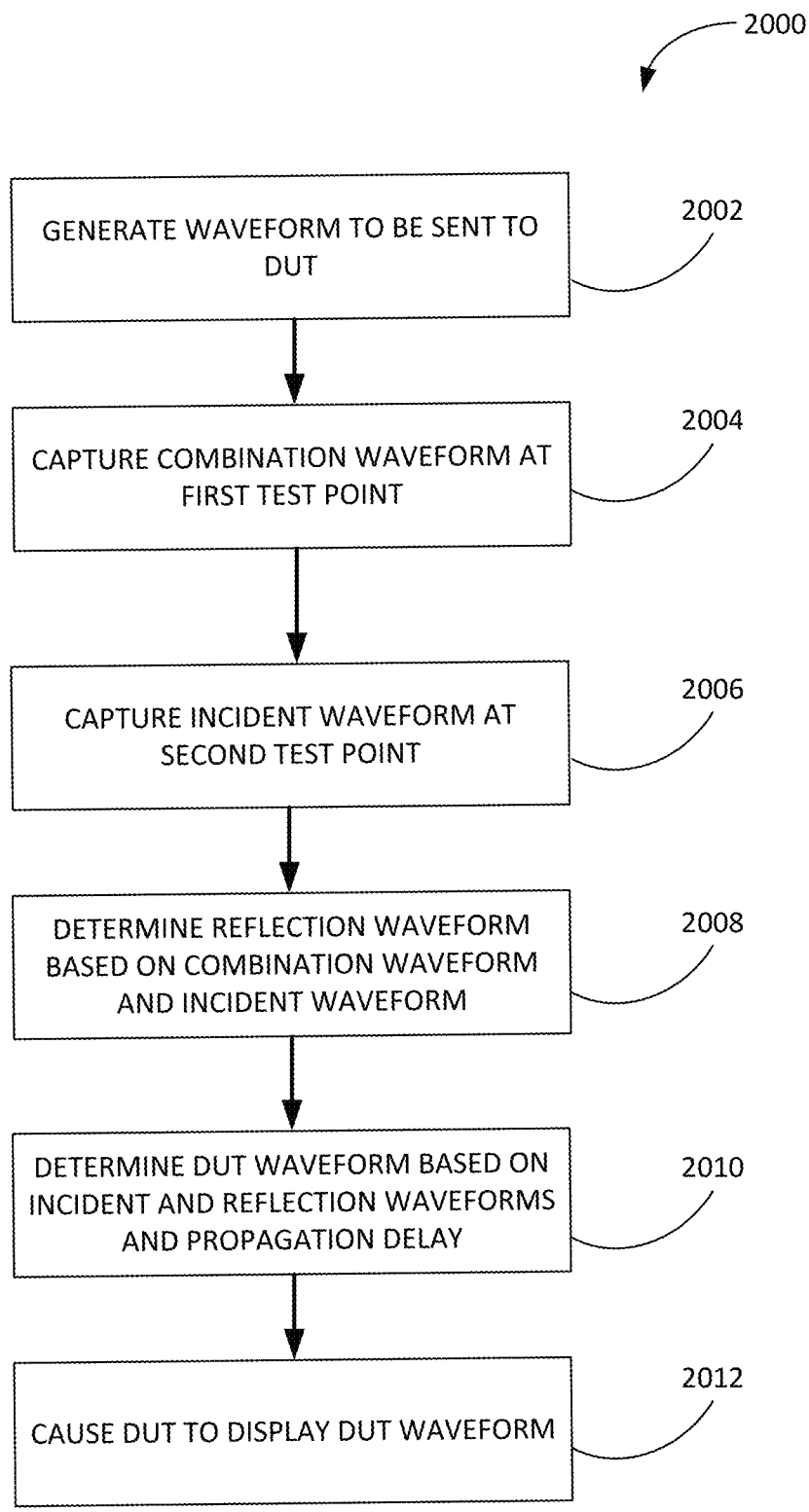
FIG. 20 is a flow chart illustrating an example of a method for determining a waveform to be displayed at a DUT.

FIG. 20 illustrates an example of a method 2000 for determining and displaying a DUT waveform using detecting circuit 1400 in the waveform monitor 404 in accordance with certain embodiments of the disclosed technology.

Initially, a signal generator generates a waveform to be sent over a cable to a device under test (DUT), as indicated at 2002. At 2004, a real-time waveform monitor (RTWM) circuit captures a combination waveform (A+B) at a first test point positioned between the signal generator and the DUT, the combination waveform (A+B) representing a combination of an incident waveform (A) and a reflection waveform (B).

At 2006, the RTWM captures the incident waveform (A) at a second test point positioned between the signal generator and the DUT. The RTWM may then determine the reflection waveform (B) based on the combination waveform (A+B) and the incident waveform (A), as indicated at 2008.

The RTWM circuit may then determine a DUT waveform based on the incident waveform (A), the reflection waveform (B), and the propagation delay (t), as indicated at 2010, and further cause a display component of the DUT to visually present the DUT waveform, as indicated at 2012.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement instrument comprising a signal generator to generate a waveform based on an input from a user, a processor, and a waveform monitor circuit. The waveform monitor circuit includes a directional coupler to receive the waveform and split the waveform into a first signal and a second signal, an output to connect to a device under test through a cable and output the first signal to the device under test, a first test point having a first test point signal that includes the first signal, a second test point having a second test point signal that includes the second signal, and a switch to connect the first test point and the second test point to the processor of the signal generator, the processor configured to determine a received waveform at the device under test based on the first test point signal and the second test point signal.

Example 2 is the test and measurement instrument of example 1, wherein the processor is further configured to determine the received waveform at the device under test based on a delay of the cable.

Example 3 is the test and measurement instrument of example 2, further comprising a user input to receive the delay of the cable.

Example 4 is the test and measurement instrument of any one of examples 1-3, wherein the first signal is half the waveform and the first test point includes the first signal plus a signal reflected through the cable from the device under test, and wherein the second signal is half the waveform and the second test point includes the second signal plus half the signal reflected through the cable from the device under test.

Example 5 is the test and measurement instrument of any one of examples 1-4, wherein the waveform monitor circuit further includes an attenuator electrically connected to the switch, an amplifier electrically connected to the attenuator, and an analog-to-digital convertor electrically connected to the amplifier and the processor.

Example 6 is the test and measurement instrument of any one of examples 1-5, further comprising a display to display the received waveform determined by the processor.

Example 7 is the test and measurement instrument of any one of examples 1-6, wherein the processor includes a field programmable gate array electrically connected to a microprocessor.

Example 8 is a method for determining a received waveform at a device under test, the method comprising generating a waveform based on a user input; splitting via a directional coupler the generated waveform into a first signal and a second signal; outputting the first signal to a device under test through a connected cable; determining a value of a first test point, the first test point including the first signal; determining a value of a second test point, the second test point including the second signal; and based on the value of the first signal at the first test point and the value of the second signal at the second test point, determining the received waveform at the device under test.

Example 9 is the method of example 8, wherein determining the received waveform at the device under test includes determining the received waveform based on a delay of the cable.

Example 10 is the method of example 9, further comprising receiving the delay of the cable through the user input.

Example 11 is the method of any one of examples 8-10, wherein the first signal is half the waveform and the first test point includes the first signal plus a signal reflected through the cable from the device under test, and wherein the second signal is half the waveform and the second test point includes the second signal plus half the signal reflected through the cable from the device under test.

Example 12 is the method of any one of examples 8-11, further comprising displaying on a display the received waveform at the device under test.

Example 13 is the method of any one of examples 8-12, further comprising switching between the first test point and the second test point via a switch.

Example 14 is a computer readable storage medium having instructions stored thereon that, when executed by a processor of a test and measurement instrument, cause the test and measurement instrument to generate a waveform based on a user input; output a first signal to a device under test through a connected cable based on the generated waveform; determine a value of a first test point, the first test point including the first signal; determine a value of a second test point, the second test point including a second signal based on the generated waveform; and determine a received waveform at the device under test through the connected cable from the output of the first signal based on the value of the first test point and the value of the second test point.

Example 15 is the computer readable storage medium of example 14, wherein the received waveform at the device under test is determined based on a delay of the cable.

Example 16 is the computer readable storage medium of example 15, wherein the instructions stored thereon further cause the test and measurement instrument to receive the delay of the cable through the user input.

Example 17 is the computer readable storage medium of any one of examples 14-16, wherein the first signal is half the waveform and the first test point includes the first signal plus a signal reflected through the cable from the device under test, and wherein the second signal is half the waveform and the second test point includes the second signal plus half the signal reflected through the cable from the device under test.

Example 18 is the computer readable storage medium of any one of examples 14-17, wherein the instructions stored thereon further cause the test and measurement instrument to display the received waveform at the device under test.

Example 19 is the computer readable storage medium of any one of examples 14-18, wherein the instructions stored thereon further cause the test and measurement instrument to switch between the first test point and the second test point via a switch.

Example 20 is a test and measurement instrument, comprising a signal generator configured to generate a waveform to be sent over a cable to a device under test (DUT); and a real-time waveform monitor (RTWM) circuit configured to determine a propagation delay (t) of the cable, capture a combination waveform (A+B) at a first test point between the signal generator and the DUT, the combination waveform (A+B) representing a combination of an incident waveform (A) and a reflection waveform (B), capture the incident waveform (A) at a second test point between the signal generator and the DUT, determine the reflection waveform (B) based on the combination waveform (A+B) and the incident waveform (A), and determine a DUT waveform based on the incident waveform (A), the reflection waveform (B), and the propagation delay (t), wherein the DUT waveform represents the waveform generated by the signal generator as received by the DUT.

Example 21 is the test and measurement instrument of example 1, wherein the RTWM circuit is configured to determine the DUT waveform using the following calculation: A(t)+B(−t), wherein A(t) represents the captured incident waveform (A) delayed by time t, and B(−t) represents the determined reflection waveform (B) delayed by time −t.

Example 22 is the test and measurement instrument of either example 20 or 21, wherein the RTWM circuit is configured to determine the reflection waveform (B) based on the combination waveform (A+B), the incident waveform (A), and an impedance of the RTWM circuit.

Example 23 is the test and measurement instrument of example 22, wherein the impedance of the RTWM circuit does not match an output impedance of the signal generator.

Example 24 is the test and measurement instrument of any one of examples 20-23, wherein the RTWM circuit is configured to determine the propagation delay (t) from a user entering the propagation delay into a user interface of the test and measurement based on a datasheet of the cable or based on a measurement made using a second separate test and measurement instrument.

Example 25 is the test and measurement instrument of any one of examples 20-24, wherein the RTWM circuit is configured to determine the propagation delay (t) based on a measurement made when the signal generator output is looped back through the cable to a trigger input of the test and measurement instrument.

Example 26 is the test and measurement instrument of any one of examples 20-25, further comprising a display to visually present the DUT waveform.

Example 27 is a method for determining a device under test (DUT) waveform, the method comprising a signal generator generating a waveform to be sent over a cable to the DUT; a real-time waveform monitor (RTWM) circuit capturing a combination waveform (A+B) at a first test point between the signal generator and the DUT, the combination waveform (A+B) representing a combination of an incident waveform (A) and a reflection waveform (B), the RTWM circuit capturing the incident waveform (A) at a second test point between the signal generator and the DUT, the RTWM circuit determining the reflection waveform (B) based on the combination waveform (A+B) and the incident waveform (A), and the RTWM circuit determining the DUT waveform based on the incident waveform (A), the reflection waveform (B), and the propagation delay (t), wherein the DUT waveform represents the waveform generated by the signal generator as received by the DUT.

Example 28 is the method of example 27, further comprising the RTWM circuit determining the propagation delay (t) of the cable.

Example 29 is the method of example 28, wherein determining the propagation delay (t) of the cable includes receiving a propagation delay value entered by a user through a user interface.

Example 30 is the method of example 28, wherein determining the propagation delay (t) of the cable includes measuring the propagation delay when the cable is looped back from an output of the signal generator output to a trigger input.

Example 31 is the method of any one of examples 27-30, wherein determining the DUT waveform includes using the following equation: A(t)+B(−t), wherein A(t) represents the captured incident waveform (A) delayed by time t, and B(−t) represents the determined reflection waveform (B) delayed by time −t.

Example 32 is the method of any one of examples 27-31, wherein determining the reflection waveform is further based on an impedance of the RTWM circuit.

Example 33 is the method of example 32, wherein the impedance of the RTWM circuit does not match an output impedance of the signal generator.

Example 34 is the method of any one of examples 27-33, further comprising visually presenting the DUT waveform on a display device.

Example 35 is a computer readable storage medium having instructions stored thereon that, when executed by a processor of a test and measurement instrument that includes a signal generator configured to output a signal to a device under test (DUT) through a cable, cause the test and measurement instrument to determine a propagation delay (t) of the cable, capture a combination waveform (A+B) at a first test point between the signal generator and the DUT, the combination waveform (A+B) representing a combination of an incident waveform (A) and a reflection waveform (B), capture the incident waveform (A) at a second test point between the signal generator and the DUT, determine the reflection waveform (B) based on the combination waveform (A+B) and the incident waveform (A), and determine a DUT waveform based on the incident waveform (A), the reflection waveform (B), and the propagation delay (t), wherein the DUT waveform represents the waveform generated by the signal generator as received by the DUT.

Example 36 is the computer readable storage medium of example 35, wherein determining the DUT waveform includes using the following calculation: A(t)+B(−t), wherein A(t) represents the captured incident waveform (A) delayed by time t, and B(−t) represents the determined reflection waveform (B) delayed by time −t.

Example 37 is the computer readable storage medium of either one of examples 35 or 36, wherein determining the reflection waveform (B) is further based on an impedance of a waveform monitoring circuit coupled to the signal generator.

Example 38 is the computer readable storage medium of example 37, wherein the impedance of the waveform monitoring circuit does not match an output impedance of the signal generator.

Example 39 is the computer readable storage medium of any one of examples 35-38, wherein the instructions stored thereon further cause the test and measurement instrument to cause a display to visually present the DUT waveform.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A single test and measurement instrument comprising:
a signal generator configured to generate an incident waveform (A) to be sent over a cable to a device under test (DUT); and
a real-time waveform monitor (RTWM) circuit configured to:
measure a propagation delay (t) of the cable caused by the cable as a signal propagates through the cable back to the RTWM circuit prior to connecting the signal generator to the DUT;
receive the incident waveform (A) from the signal generator and send the incident waveform (A) to the DUT;
capture a first waveform at a first test point within the RTWM circuit between the signal generator and the DUT, the first waveform representing a combination of the incident waveform (A) and a reflection waveform (B);
capture a second waveform at a second test point within the RTWM circuit between the signal generator and the DUT, the RTWM circuit having a switch to select between the first test point and the second test point;
determine the reflection waveform (B) and the incident waveform (A) based on the first waveform and the second waveform;
determine a DUT waveform based on the incident waveform (A), the reflection waveform (B), and the propagation delay (t), wherein the DUT waveform represents the incident waveform (A) generated by the signal generator as received by the DUT; and
a user interface to allow a user to provide adjustments to the signal generator as needed to cause the DUT to receive a desired DUT waveform.

2. The single test and measurement instrument of claim 1, wherein the RTWM circuit is configured to determine the DUT waveform using calculation: A(t)+B(−t), wherein A(t) represents the incident waveform (A) delayed by the propagation delay (t), and B(−t) represents the reflection waveform (B) delayed by the propagation delay (t) from the DUT.

3. The single test and measurement instrument of claim 1, wherein the RTWM circuit is configured to determine the reflection waveform (B) based on the first waveform, the second waveform, and an impedance of the RTWM circuit.

4. The single test and measurement instrument of claim 3, wherein the impedance of the RTWM circuit does not match an output impedance of the signal generator.

5. The single test and measurement instrument of claim 1, wherein the RTWM circuit is configured to determine the propagation delay (t) from the user entering the propagation delay into the user interface of the single test and measurement instrument based on a datasheet of the cable or based on a measurement made using a second separate test and measurement instrument.

6. The single test and measurement instrument of claim 1, wherein the RTWM circuit is configured to determine the propagation delay (t) based on a measurement made when the signal generator output is looped back through the cable to a trigger input of the single test and measurement instrument.

7. The single test and measurement instrument of claim 1, further comprising a display to visually present the DUT waveform.

8. A method for determining a device under test (DUT) waveform, the method comprising:
generating, from a signal generator in a single test and measurement instrument, an incident waveform (A) to be sent over a cable to a DUT;
measuring, at a real-time waveform monitor (RTWM) circuit in the single test and measurement instrument, a propagation delay (t) of the cable caused by the cable as a signal propagates through the cable back to the RTWM circuit prior to connection of the signal generator to the DUT;
the real-time waveform monitor (RTWM) circuit capturing a first waveform at a first test point between the signal generator and the DUT, the first waveform representing a combination of the incident waveform (A) and a reflection waveform (B);
switching between the first test point and a second test point, the first test point and the second test point being within the RTWM circuit;
the RTWM circuit capturing a second waveform at the second test point between the signal generator and the DUT;
the RTWM circuit determining the reflection waveform (B) and the incident waveform (A) based on the first waveform and the second waveform;
the RTWM circuit determining the DUT waveform based on the incident waveform (A), the reflection waveform (B), and the propagation delay (t), wherein the DUT waveform represents the incident waveform (A) generated by the signal generator as received by the DUT; and
receiving user inputs as needed to adjust the signal generator to provide a desired waveform at the DUT.

9. The method of claim 8, wherein determining the propagation delay (t) of the cable includes receiving a propagation delay value entered by a user through a user interface.

10. The method of claim 8, wherein determining the propagation delay (t) of the cable includes measuring the propagation delay (t) when the cable is looped back from an output of the signal generator to a trigger input of the RTWM circuit.

11. The method of claim 8, wherein determining the DUT waveform includes using equation: A(t)+B(−t), wherein A(t) represents the incident waveform (A) delayed by the propagation delay (t), and B(−t) represents the reflection waveform (B) delayed by the propagation delay (t) from the DUT.

12. The method of claim 8, wherein determining the reflection waveform (B) is further based on an impedance of the RTWM circuit.

13. The method of claim 12, wherein the impedance of the RTWM circuit does not match an output impedance of the signal generator.

14. The method of claim 8, further comprising visually presenting the DUT waveform on a display device.

15. A non-transitory computer readable storage medium having instructions stored thereon that, when executed by a processor of a single test and measurement instrument that includes a signal generator configured to output a signal to a device under test (DUT) through a cable, cause the single test and measurement instrument to:

measure a propagation delay (t) of the cable caused by the cable as the signal propagates through the cable back to the single test and measurement instrument prior to connecting the signal generator to the DUT;

capture a first waveform at a first test point in the single test and measurement instrument between the signal generator and the DUT, the first waveform representing a combination of an incident waveform (A) and a reflection waveform (B);

capture a second waveform at a second test point in the single test and measurement instrument between the signal generator and the DUT;

determine the reflection waveform (B) and the incident waveform (A) based on the first waveform and the second waveform;

determine a DUT waveform based on the incident waveform (A), the reflection waveform (B), and the propagation delay (t), wherein the DUT waveform represents the incident waveform (A) generated by the signal generator as received by the DUT; and receiving user inputs as needed to adjust the signal generator to provide a desired waveform at the DUT.

16. The non-transitory computer readable storage medium of claim 15, wherein determining the DUT waveform includes using calculation: A(t)+B(−t), wherein A(t) represents the incident waveform (A) delayed by the propagation delay (t), and B(−t) represents the reflection waveform (B) delayed by the propagation delay (t) from the DUT.

17. The non-transitory computer readable storage medium of claim 15, wherein determining the reflection waveform (B) is further based on an impedance of a waveform monitoring circuit coupled to the signal generator.

18. The non-transitory computer readable storage medium of claim 17, wherein the impedance of the waveform monitoring circuit does not match an output impedance of the signal generator.

19. The non-transitory computer readable storage medium of claim 15, wherein the instructions stored thereon further cause the single test and measurement instrument to cause a display to visually present the DUT waveform.

* * * * *